(12) United States Patent
Shi et al.

(10) Patent No.: US 12,176,190 B2
(45) Date of Patent: Dec. 24, 2024

(54) ARC MANAGEMENT ALGORITHM OF RF GENERATOR AND MATCH BOX FOR CCP PLASMA CHAMBERS

(71) Applicant: Applied Materials, Inc., Santa Clara, CA (US)

(72) Inventors: Tiefeng Shi, San Jose, CA (US); Gang Fu, Cupertino, CA (US); Keith A. Miller, Mountain View, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 18/118,543

(22) Filed: Mar. 7, 2023

(65) Prior Publication Data

US 2024/0304429 A1  Sep. 12, 2024

(51) Int. Cl.
*H01J 37/32* (2006.01)
*G06N 3/09* (2023.01)

(52) U.S. Cl.
CPC .......... *H01J 37/32944* (2013.01); *G06N 3/09* (2023.01); *H01J 37/32091* (2013.01); *H01J 2237/24564* (2013.01)

(58) Field of Classification Search
None
See application file for complete search history.

(56) References Cited

U.S. PATENT DOCUMENTS

| | | | |
|---|---|---|---|
| 8,334,700 B2 | 12/2012 | Coumou et al. | |
| 9,170,295 B2 | 10/2015 | Choi | |
| 2006/0049831 A1* | 3/2006 | Anwar | G01R 31/1254 324/536 |
| 2006/0081564 A1* | 4/2006 | Moroz | H01J 37/32935 219/121.43 |
| 2007/0042131 A1 | 2/2007 | Soo et al. | |
| 2007/0047169 A1* | 3/2007 | Tong | H01J 37/32082 361/234 |
| 2008/0141940 A1* | 6/2008 | Hoffman | H01J 37/32495 333/32 |
| 2008/0156632 A1 | 7/2008 | Van Zyl | |
| 2010/0285629 A1* | 11/2010 | Suzuki | C23C 16/515 438/57 |
| 2011/0315662 A1* | 12/2011 | Byron | H01H 33/66 218/140 |
| 2012/0259562 A1 | 10/2012 | Booth et al. | |
| 2019/0298994 A1* | 10/2019 | Lucke | A61B 18/14 |
| 2020/0066494 A1* | 2/2020 | Murakami | H01J 37/32495 |
| 2021/0022212 A1* | 1/2021 | Cimino | H01L 21/67063 |
| 2021/0280400 A1* | 9/2021 | Pan | H01J 37/32935 |
| 2021/0358785 A1* | 11/2021 | Merton | H01J 37/32926 |
| 2022/0208532 A1* | 6/2022 | Gajewski | H01J 37/34 |
| 2022/0336294 A1* | 10/2022 | Yang | H01J 37/32963 |

(Continued)

*Primary Examiner* — Wilson Lee
(74) *Attorney, Agent, or Firm* — Moser Taboa

(57) ABSTRACT

Methods, apparatuses and systems for detecting and managing arc events during a plasma chamber process include receiving impedance data measured during a plasma chamber process, analyzing the impedance data to determine if an arc event is occurring during the plasma chamber process, and if it is determined that an arc event is occurring, an action is taken to suppress an arc of the arc event. In some instances, a machine learning model that has been trained to recognize when an arc event is occurring from received measurement data is used to determine if an arc event is occurring.

14 Claims, 8 Drawing Sheets

(56) References Cited

U.S. PATENT DOCUMENTS

| | | | |
|---|---|---|---|
| 2022/0406581 A1* | 12/2022 | Guo | H01J 37/32944 |
| 2023/0107556 A1* | 4/2023 | Tao | G03F 1/36 716/53 |

* cited by examiner

ARC MANAGEMENT ALGORITHM OF RF GENERATOR AND MATCH BOX FOR CCP PLASMA CHAMBERS

FIELD

Embodiments of the present disclosure generally relate to arc detection in plasma chambers and more specifically to methods, apparatuses and systems including a novel arc management algorithm for use with arc detection.

BACKGROUND

An arc generated in a load where a power is consumed may cause damage to a power supply or the load. Although it is preferred to substantially prevent the generation of the arc, the arc may occur due to various factors. Therefore, technical efforts have been continued to detect the generation of arc. In particular, for a plasma process where a RF power is used, the generated arc may damage a plasma chamber and contaminate the materials to be processed. In this regard, technologies have been suggested to detect the arc generated in the chamber and to rapidly block it.

For example, there is a process comprising detecting unexpected changes in a reflected power, checking whether an arc is generated or not, and blocking or reducing a RF power supplied. However, it is difficult to increase its feasibility since the arc generated in the plasma chamber does not necessarily lead to the increase in the reflected power. In addition, other processes for detecting the generated arc include detecting a voltage value and a current value of the RF power, calculating a value of a voltage and current ratio with the detected voltage and current values, and determining whether the arc is generated or not based on the calculated value of the voltage and current ratio. However such voltage/current detection methods can detect false arcs and inaccurately detect the real arcs. In addition, such voltage/current detection methods also function poorly with pulsing signals.

A semiconductor fabrication process using plasma requires very high precision. Accordingly, there is a need for a method, apparatus and system to precisely detect the arc generated in the chamber.

SUMMARY OF THE INVENTION

Methods, apparatuses and systems for a novel arc management algorithm for use with arc detection are provided herein.

In some embodiments, a method for detecting and managing arc events in a plasma chamber process include receiving impedance data measured during a plasma chamber process, analyzing the impedance data to determine if an arc event is occurring during the plasma chamber process, and if it is determined that an arc event is occurring, an action is taken to suppress an arc of the arc event. In some embodiments, a machine learning model that has been trained to recognize when an arc event is occurring from received measurement data is used to determine if an arc event is occurring.

In some embodiments, a method for detecting and managing arc events during a plasma chamber process includes measuring at least one of impedance values or voltage and current values at an output of an RF generator or an input of a process chamber during the plasma chamber process, determining from the measured impedance values, using a machine learning (ML) model, if an arc is occurring during the plasma chamber process, determining from the measured voltage and current values if a microarc is occurring during the plasma chamber process, and if at least one of an arc or microarc is occurring during the plasma chamber process, taking action to suppress the at least one of the arc or microarc.

In some embodiments, the method can further include, after taking the action to suppress the arc, remeasuring at least one of the impedance values or the voltage and current values at the output of the RF generator or the input of a process chamber during the plasma chamber process, determining from the remeasured impedance values using the machine learning (ML) model, if the arc still exists during the plasma chamber process, determining from the remeasured voltage and current values, if the microarc still exists, if the arc does not still exist, determining from the remeasured at least one of impedance values or voltage and current values, using the machine learning (ML) model, if the plasma has been destroyed, and if the plasma has been destroyed, reigniting the plasma.

In some embodiments, a computer-implemented method of training a machine learning model for detecting and managing arc events in a plasma chamber process includes collecting impedance values measured at an output of an RF generator or an input of a process chamber during respective ignition phases of a plurality of plasma chamber processes, creating a first training set from the collected, measured impedance values of the ignition phases, training the machine learning model in a first stage using the first training set, collecting impedance values measured at an output of an RF generator or an input of a process chamber during respective process phases of a plurality of plasma chamber processes, creating a second training set from the collected, measured impedance values of the process phases, training the machine learning model in a second stage using the second training set, collecting impedance values measured at an output of an RF generator or an input of a process chamber for respective arc events occurring during a plurality of plasma chamber processes, creating a third training set from the collected, measured impedance values of the arc events, and training the machine learning model in a third stage using the third training set.

In some embodiments, an apparatus for detecting and managing arc events in a plasma chamber process includes a processor, and a memory coupled to the processor, the memory having stored therein at least one of programs or instructions. In some embodiments, the programs and instructions when executed by the processor configure the apparatus to receive impedance measurement data captured during the plasma chamber process, analyze the impedance measurement data to determine if an arc event is occurring during the plasma chamber process, and if it is determined that an arc event is occurring, take an action to suppress an arc of the arc event.

In some embodiments, the apparatus is further configured to receive at least one of inductance, capacitance, voltage or current measurement data, and further analyze the received at least one of the inductance, capacitance, voltage or current measurement data to determine if an arc event is occurring.

In some embodiments, the apparatus is further configured to, after taking the action to suppress the arc, take additional impedance data measurements, analyze the additional impedance data measurements to determine if the additional impedance data measurements include impedance data measurements that are equal to or within a tolerance of impedance data measurements captured during the process phase of the plasma chamber process, and if the additional impedance data measurements include impedance data measurements that are equal to or within a tolerance of impedance data measurements captured during the process phase of the plasma chamber process, determine that the arc was suppressed.

In some embodiments, the apparatus is further configured to analyze the additional impedance data measurements to determine if the additional impedance data measurements include impedance data measurements that are equal to or within a tolerance of impedance data measurements captured during the ignition phase of the plasma chamber process, if the additional impedance data measurements include impedance data measurements that are equal to or within a tolerance of impedance data measurements captured during the ignition phase of the plasma chamber process, determine that a plasma of the plasma chamber process was destroyed, and if the plasma was destroyed, reignite the plasma.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1A:
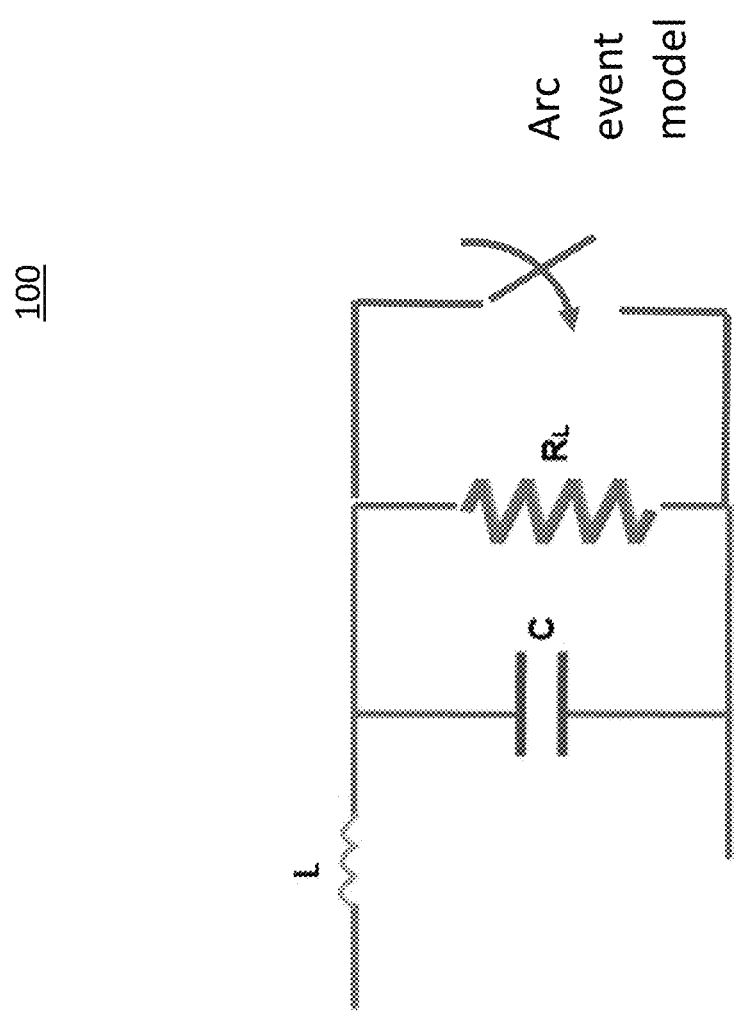
FIG. 1A depicts a graphical representation of an arc event impedance model 100 in accordance with an embodiment of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The following detailed description describes techniques (e.g., methods, apparatuses, and systems) for the detection of arcs in plasma chambers and for a novel arc management algorithm. While the concepts of the present principles are susceptible to various modifications and alternative forms, specific embodiments thereof are shown by way of example in the drawings and are described in detail below. It should be understood that there is no intent to limit the concepts of the present principles to the particular forms disclosed. On the contrary, the intent is to cover all modifications, equivalents, and alternatives consistent with the present principles and the appended claims.

FIG. 1A depicts a graphical representation of an arc event impedance model 100 in accordance with an embodiment of the present principles. The arc event impedance model 100 of FIG. 1A illustrates a relationship between an inductance, L, a capacitance, C, and a Resistance, R, of a chamber, such as a CCP chamber, during an Arc event. In the arc event impedance model 100 of FIG. 1A, L represents a feed inductance, which is a constant, dominated by a chamber structure; C represents a total capacitance including a capacitance between a cathode and a grounded wafer, and a capacitance between the cathode and the chamber wall, in which the latter capacitance changes with plasma density (sheath cap and RF power dependence); and RL represents Plasma resistance, which is dependent on Rf power and is infinite without plasma (i.e., cold chamber). As depicted in FIG. 1A, when the arc event is happening, arc functionally performs like a switch in parallel with the plasma resistance, RL. As such, resistance measurements are minimal (i.e., functions like a short). In some embodiments, the type of arc event is defined by a duration of the arc in the chamber. For example, in some embodiments a microarc can be defined as an arc lasting less than 1-100 ms in the chamber and a hard arc is an arc lasting longer than 100 ms in the chamber.

Figure 1B:
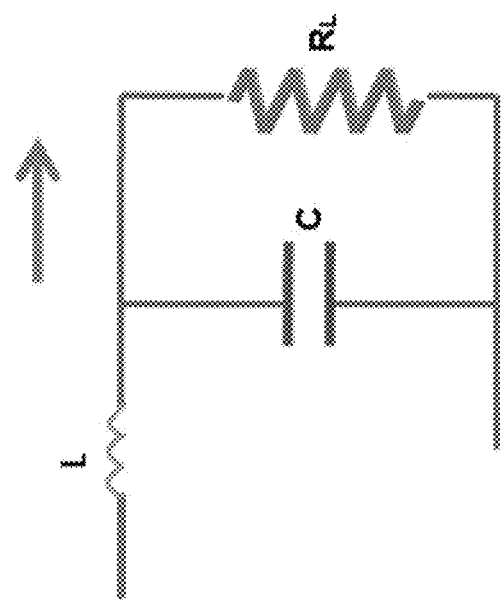
FIG. 1B depicts a graphical representation of a chamber process impedance model in accordance with an embodiment of the present principles.

FIG. 1B depicts a graphical representation of a chamber process impedance model 125 in accordance with an embodiment of the present principles. The chamber process impedance model 125 of FIG. 1B illustrates a relationship between an inductance, L, a capacitance, C, and a Resistance, R, of a chamber, such as a CCP chamber, during a chamber process. In the chamber process impedance model 125 of FIG. 1B, L again represents a feed inductance, which is a constant, dominated by a chamber structure; C represents a total capacitance including a capacitance between a cathode and a grounded wafer, and a capacitance between the cathode and the chamber wall, in which the latter capacitance changes with plasma density; and RL represents Plasma resistance, which is dependent on Rf power and is infinite without plasma (i.e., cold chamber). As depicted in FIG. 1B, during a chamber process, a resistance value is between the minimal resistance values present during an arc event as depicted in FIG. 1A and infinite resistance values of an ignition process depicted in FIG. 1C. In some embodiments, a process resistance value as represented by FIG. 1B, can be fixed and dependent upon the components and arrangement of a process chamber system. As such, a machine learning process of the present principles (as described in greater detail below) can be trained to recognize a process chamber system and as such can be trained to identify a resistance value associated with a recognized process chamber system.

Figure 1C:
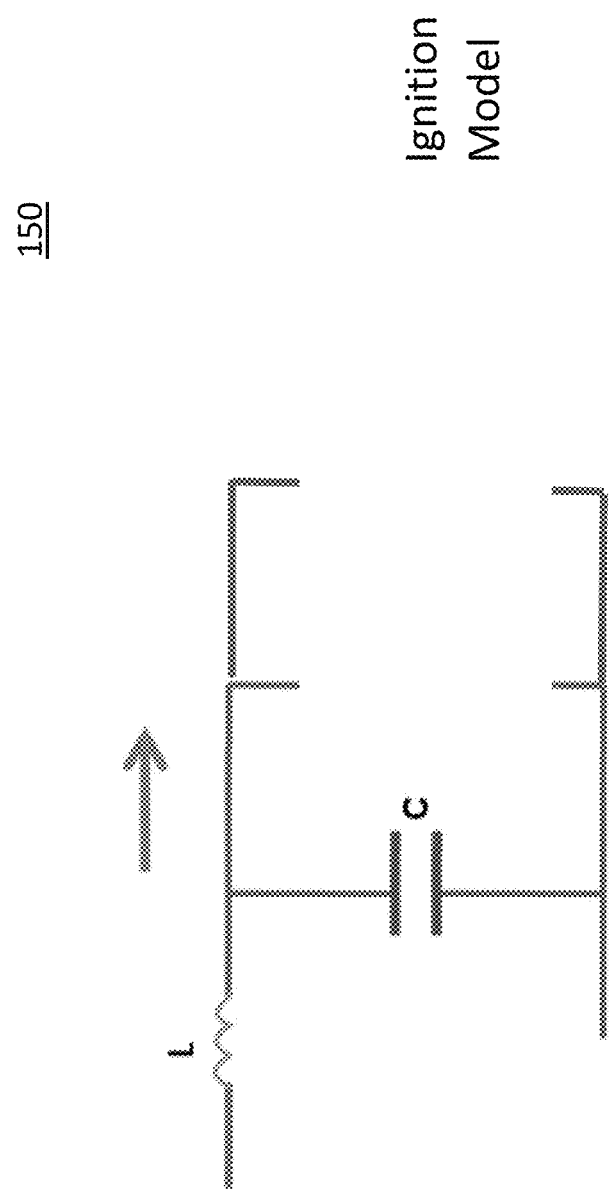
FIG. 1c depicts a graphical representation of an ignition process impedance model in accordance with an embodiment of the present principles.

FIG. 1C depicts a graphical representation of an ignition process impedance model 150 in accordance with an embodiment of the present principles. The ignition process impedance model 150 of FIG. 1c illustrates a relationship between an inductance, L, a capacitance, C, and a Resistance, R, of a chamber, such as a CCP chamber, during an ignition process. In the ignition process impedance model 150 of FIG. 1C, L again represents a feed inductance, which is a constant, dominated by a chamber structure and C represents a total capacitance including a capacitance between a cathode and a grounded wafer, and a capacitance between the cathode and the chamber wall. As depicted in FIG. 1C, during the ignition process resistance is infinite because there is no plasma (i.e., cold chamber).

Figure 2:
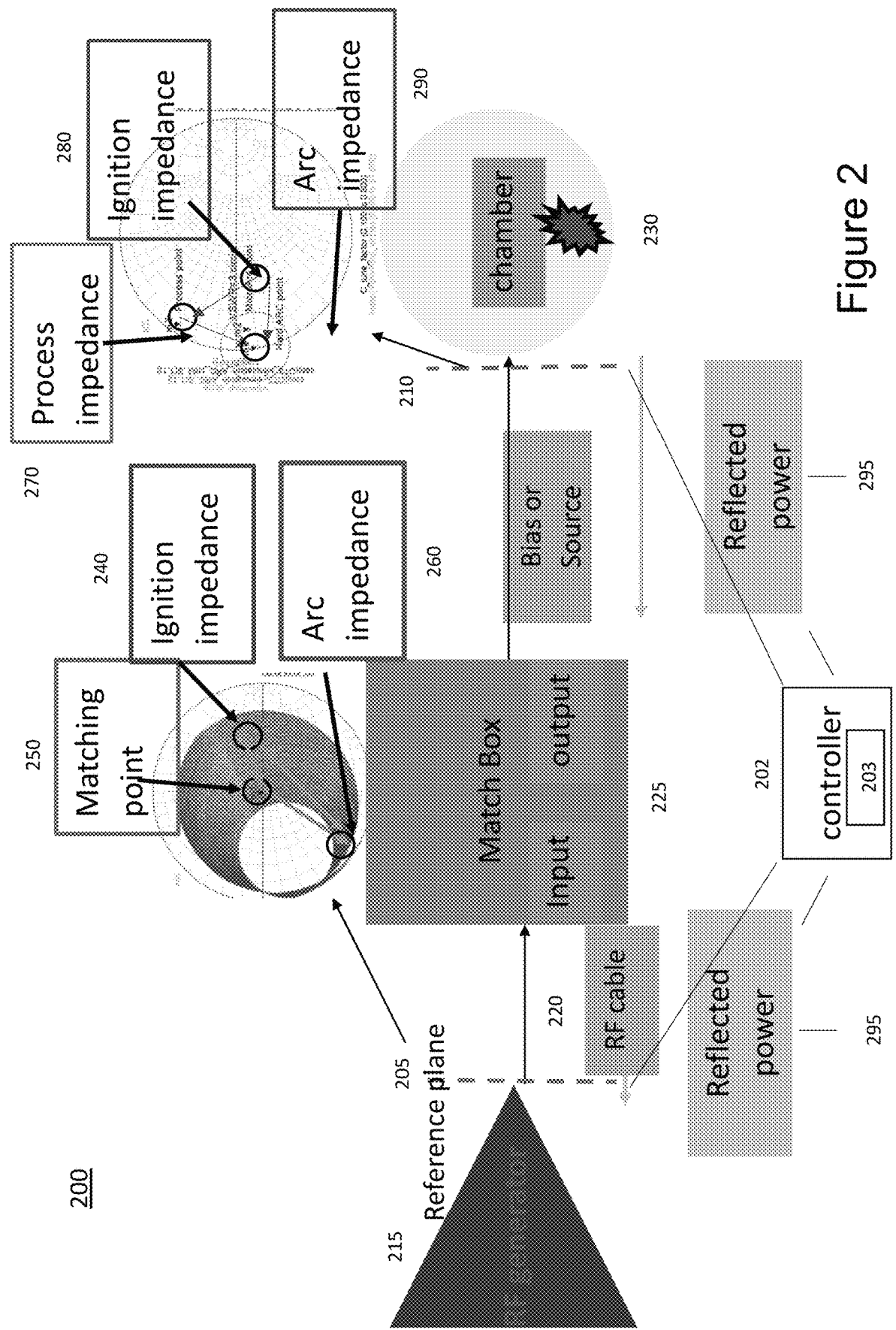
FIG. 2 depicts a graphical representation of a CCP chamber process system including two representative impedance reference planes, an RF generator output impedance reference plane and a chamber impedance reference plane in accordance with an embodiment of the present principles.

FIG. 2 depicts a graphical representation of a CCP chamber process system 200 including two representative impedance reference planes, an RF generator output impedance reference plane 205 and a chamber impedance reference plane 210 in accordance with an embodiment of the present principles. More specifically, in the embodiment of FIG. 2, an RF generator 215 provides power to an input of a matching box 225 via an RF cable 220. The output of the matching box 225 is communicated to a process chamber 230. The chamber process system 200 of FIG. 2 can further include a controller 202. In some embodiments the controller 202 can include a computing device (described in further detail below with reference to FIG. 6).

In accordance with the present principles and as depicted in FIG. 2, the output of the RF generator 215 can include a location at which an impedance of the chamber process can be monitored, for example, as depicted in the RF generator output impedance reference plane 205. More specifically, in the embodiment of FIG. 2, at the output of the RF generator 215 at least an impedance value can be measured during, including but not limited to, an ignition phase 240, during a matching phase 250 of the process, and during an arc event 260. More specifically, in some embodiments of the present principles, an impedance value is measured at the output of the RF generator 215 during the ignition phase 240 of the chamber process with a cold chamber (i.e., no plasma) to establish a base impedance value for the chamber process when no plasma is present. In addition, in some embodiments, an impedance valued is measured at the output of the RF generator 215 during a normal process phase 250 of the chamber process to establish a base impedance value for the chamber process during a normal functioning of the chamber process. Even further, in some embodiments, an impedance valued is measured at the output of the RF generator 215 during an arc event 260 in the chamber process to establish a base impedance value for the chamber process during an arc event in the chamber process.

As depicted in the RF generator output impedance reference plane 205 of FIG. 2, an impedance value during an arc event 260 is very different than impedance values measured during the ignition phase 240 and the matching (process) phase 250 of the chamber process. As such, by taking impedance measurements during the chamber process, the occurrence of an arc event can be identified by the identification of a measured impedance value equal to or within a tolerance of the impedance value identifying the occurrence of an arc event. For example, impedance values during arc events (and during other phases) can vary and, in accordance with the present principles, a tolerance can be determined and set from, for example, historical impedance values measured during arc events (and other phases), and impedance measurement values that fall within a determined tolerance can be indicative of the occurrence of an arc event (and other phases).

In addition, the base ignition phase impedance values and base process phase impedance values of the present principles can be used to determine at what point in a chamber process a system is at or to determine whether or not a plasma exists, keeping in mind that the base ignition impedance value was measured during a cold start (no plasma) of the chamber process.

Alternatively or in addition, in some embodiments of the present principles, a base inductance, L, value and/or a base capacitance, C, value of the chamber process can also be established as described above by measurement of the inductance or capacitance at an output of the RF generator 215 for at least the ignition phase 240, the matching phase 250 and during the occurrence of an arc event. As such, by taking at least one of inductance and/or capacitance measurements during the chamber process, the occurrence of an arc event can be identified by the identification of a measured inductance and/or capacitance value equal to or within a tolerance of the previously measured inductance and/or capacitance value identifying the occurrence of an arc event. In addition, the base ignition phase inductance and/or capacitance values and base process phase inductance and/or capacitance values can be used to determine at what point in a chamber process a system is at or to determine whether or not a plasma exists, keeping in mind that, in accordance with the present principles, the base ignition inductance and/or capacitance values were measured during a cold start (no plasma) of the chamber process.

With reference back to the RF generator output impedance reference plane 205 of FIG. 2 and the arc event impedance model 100 of FIG. 1, during an arc event 260 in the chamber process system 200 of FIG. 2, a measured impedance will be negligible in comparison to the ignition phase 240 and/or the matching phase 250 of the chamber process system 200. Specifically and with reference to the arc event impedance model 100 of FIG. 1, during an arc event, the arc functionally performs like a switch in parallel with the plasma resistance, RL, and the impedance of the chamber process becomes negligible.

Referring back to the chamber process system 200 of FIG. 2, alternatively or in addition, in some embodiments of the present principles, impedance values of a chamber process can be monitored/measured at the input of the process chamber 230 as depicted in the chamber impedance reference plane 210. More specifically, in the embodiment of FIG. 2, at the input of the process chamber 230 at least an impedance value can be measured during, including but not limited to, an ignition phase 270, a process phase 280 of the process chamber, and during an arc event 290. More specifically, in some embodiments, an impedance value is measured at the input of the process chamber 230 during the ignition phase 270 of the chamber process with a cold chamber (i.e., no plasma) to establish a base impedance value for the chamber process when no plasma is present. In addition or alternatively, in some embodiments, an impedance value is measured at the input of the process chamber 230 during a normal process phase 280 of the chamber process to establish a base impedance value for the chamber process during a normal functioning of the chamber process. Similarl7, an impedance value can be measured at the input of the process chamber 230 during an arc event 290 occurring during a process of the process chamber to establish a base impedance value for the chamber process during an arc event.

As depicted in the chamber impedance reference plane 210 of FIG. 2, an impedance value during an arc event 290 is very different than impedance values measured during the ignition phase 270 and the process phase 280 of the chamber process. As such, by taking impedance measurements during the chamber process, the occurrence of an arc event can be identified by the identification of a measured impedance value equal to or within a tolerance of the impedance value identifying the occurrence of an arc event. In addition, the base ignition phase impedance values and base process phase impedance values can be used to determine at what point in a chamber process a system is at or to determine whether or not a plasma exists, keeping in mind that the base ignition impedance value was measured during a cold start (no plasma) of the chamber process.

Alternatively or in addition, in some embodiments of the present principles, a base inductance, L, value and/or a base capacitance, C, value of the chamber process can also be established as described above as measured at the input of the process chamber 230 for at least the ignition phase 270, the process phase 280 and during the occurrence of an arc event 290. As such, by taking at least one of inductance and/or capacitance measurements during the chamber process, the occurrence of an arc event can be identified by the identification of a measured inductance and/or capacitance value equal to or within a tolerance of the inductance and/or capacitance value identifying the occurrence of an arc event. In addition, the base ignition phase inductance and/or capacitance values and base process phase inductance and/or capacitance values can be used to determine at what point in a chamber process a system is at or to determine whether or not a plasma exists, keeping in mind that the base ignition inductance and/or capacitance values were measured during a cold start (no plasma) of the chamber process.

It should be noted, however, that microarc events (arc events lasting only a few milliseconds to a few hundred milliseconds), because of their brevity, may not be detected by measuring impedance values. For example, the RF matching box 225 may not respond fast enough to a fast-changing impedance due to a microarc. As such, in such instances, and as reflected in FIG. 2, reflected power 295 may need to be monitored and measured to detect microarcs. From the measured reflected power 295, voltage and current of the reflected power can be measured to be able to identify microarcs during the chamber process.

In accordance with the present principles, by monitoring chamber impedance and/or reflected power as described above, an arc event in a chamber process can be recognized and a response to the arc event (i.e., turning off RF power) can be triggered based on the recognized arc event. For example and with reference to the chamber process system 200 of FIG. 2, the controller 202 can receive the impedance measurement data (and in some embodiments inductance and capacitance measurement data) and form the received data the controller 202 can determine if an arc event (e.g., a microarc and/or a hard arc) is occurring. Once the arc event has been determined by the controller 202 to be occurring, the controller 202 can take arc suppression action to remove the arc. For example, in some embodiments, a controller of the present principles, such as the controller 202 of FIG. 2 can have stored therein or in a storage device (not shown) accessible to the controller 202, impedance measurement values at which arc events occur. The controller 202, upon receiving an impedance measurement value that indicates that an arc event is occurring can take action to suppress the arc event, such as turning off the power to and/or blocking the power from the RF generator 215. In some embodiments, alternatively or in addition, the power from the RF generator 215 can be delayed to suppress any generated arcs.

In some embodiments, after an action is taken to attempt to suppress the identified arc event, an impedance value can again be measured (i.e., at the output of the RF generator 215 and/or at the input of the process chamber 230) to determine if the arc was removed. For example, if after the identified arc was attempted to be suppressed, a measured impedance value is equal to or within a tolerance of a previously measured normal process impedance value, then it can be determined that the arc was suppressed. However, if after the identified arc was attempted to be suppressed, a measured impedance value is equal to or within a tolerance of a previously measured impedance value of an ignition phase, then it can be determined that the plasma was destroyed/killed by the arc event.

Alternatively or in addition, in some embodiments and as described above, the controller 202 can received data regarding monitored and measured reflected power and specifically voltage and current measurements to determine from the reflected power, when a microarc is occurring using known techniques. In instances where necessary, the controller 202 can take action to suppress detected microarcs.

In some embodiments of the present principles, a machine learning (ML) model can be trained to recognize at least one of impedance, inductance, and/or capacitance data/measurements that are indicative of at least one of the occurrence of a hard arc event, an ignition phase of a chamber process (i.e., no plasma), and or a normal process phase of a chamber process. In some embodiments, the ML model can be further trained to recognize voltage and current data/measurements that are indicative of the occurrence of a microarc. For example, in some embodiments of the present principles, the controller 202 can include a machine learning process/model 203 having an ML model trained to recognize at least one of arc events, an ignition phase (i.e., no plasma), and/or a process phase of a chamber process in accordance with embodiments of the present principles. In some embodiments, the ML process/model 203 can include a multi-layer neural network comprising nodes that are trained to have specific weights and biases. In some embodiments, the ML process/model 203 employs artificial intelligence techniques or machine learning techniques to analyze received measurements including but not limited to impedance, inductance, capacitance, voltage and current measurements. In some embodiments in accordance with the present principles, suitable machine learning techniques can be applied to learn commonalities in sequential application programs and for determining from the machine learning techniques at what level sequential application programs can be canonicalized. In some embodiments, machine learning techniques that can be applied to learn commonalities in sequential application programs can include, but are not limited to, regression methods, ensemble methods, or neural networks and deep learning such as 'Se2oSeq' Recurrent Neural Network (RNNs)/Long Short-Term Memory (LSTM) networks, Convolution Neural Networks (CNNs), graph neural networks applied to the abstract syntax trees corresponding to the sequential program application, and the like. In some embodiments a supervised ML classifier could be used such as, but not limited to, Multilayer Perceptron, Random Forest, Naive Bayes, Support Vector Machine, Logistic Regression and the like.

The ML process/model 203 can be trained using a plurality (e.g., hundreds, thousands, tens of thousands, etc.) of instances of labeled content in which the training data comprises a plurality of instances of at least some of impedance measurement data, capacitance measurement data, inductance measurement data, and voltage and current measurement data to train the ML process/model 203 to recognize arc events, such as hard arcs and microarcs, that occur during a chamber process, and to further recognize an ignition phase (i.e., no plasma) and/or a process phase of a chamber process as described above. In accordance with the present principles, the ML process/model 203 can be trained using historical data of arc events, ignition phases, and process phases, and respective measurement data, occurring in different chamber processes and/or with different components using various plasma instances to enable a ML process/model of the present principles to recognize arc events, ignition phases, and normal process phases occurring in substantially any chamber process. Over time, the ML process/model learns to look for specific measurement values in received measurement data to identify arc events, ignition phases, and normal process phases occurring in plasma chamber processes.

Figure 3:
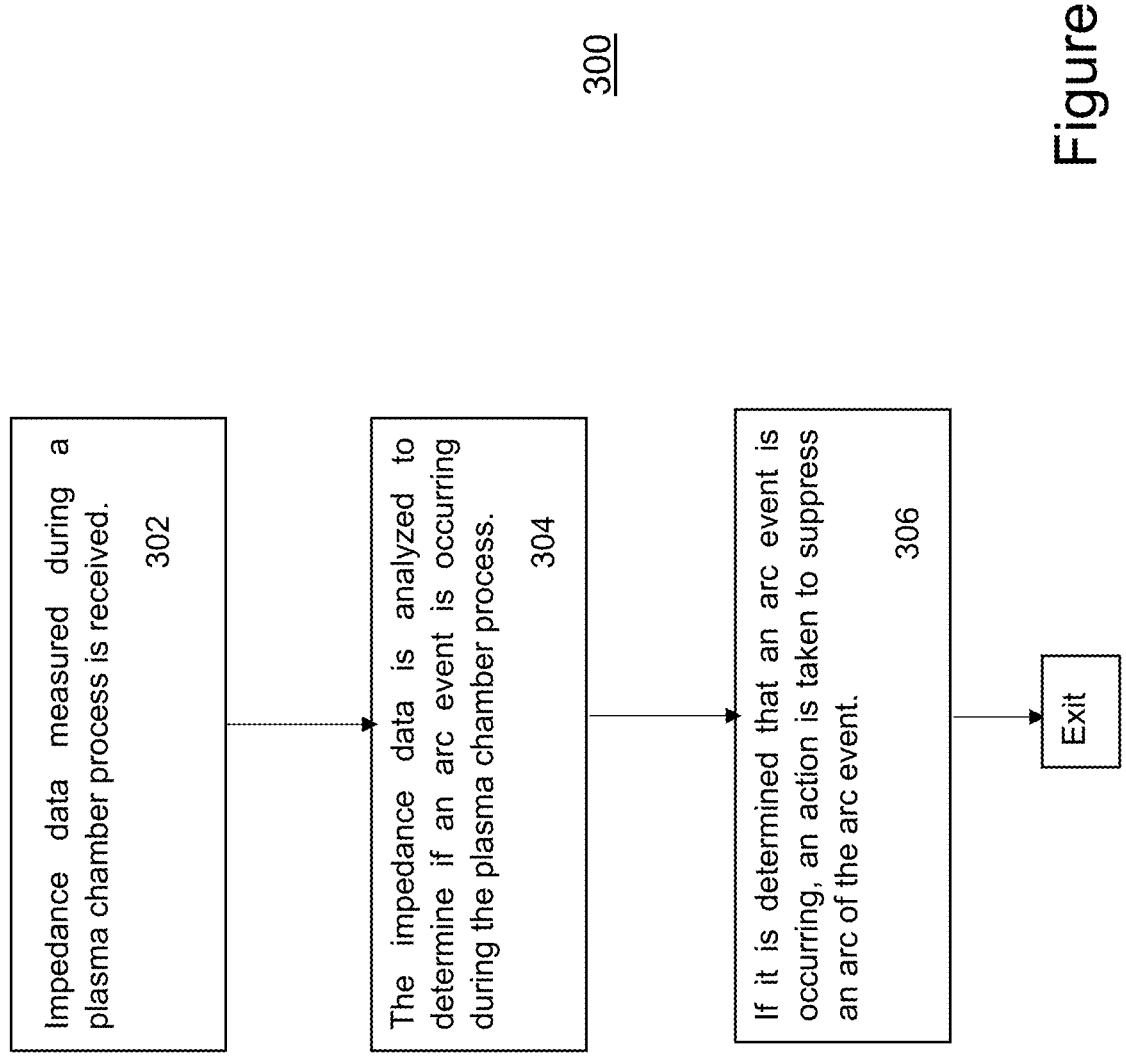
FIG. 3 depicts a flow diagram of a method for detecting and managing arc events in a plasma chamber process in accordance with an embodiment of the present principles.

FIG. 3 depicts a flow diagram of a method 300 for detecting and managing arc events in a plasma chamber process in accordance with an embodiment of the present principles. The method 300 can begin at 302 during which impedance measurement data captured during a plasma chamber process is received. The method 300 can proceed to 304.

At 304, the impedance data is analyzed to determine if an arc event is occurring during the plasma chamber process. The method 300 can proceed to 306.

At 306, if it is determined that an arc event is occurring, an action is taken to suppress an arc of the arc event. The method 300 can then be exited.

In some embodiments, in the method 300 the impedance measurement data captured during a plasma chamber process is captured during at least one of an ignition phase, a process phase or an arc event during the plasma chamber process.

In some embodiments, the method 300 can further include receiving at least one of inductance, capacitance, voltage or current measurement data. In such embodiments, the additional data received can be used to determine if an arc event is occurring during the plasma chamber process.

In some embodiments, in the method 300 the received data originates from at least one of measurements taken at an output of an RF generator or an input of a process chamber.

In some embodiments, in the method 300 the received data can include measurements taken during at least one of an ignition phase or a process phase of the plasma chamber process.

In some embodiments, in the method 300 an arc event is determined to be occurring by comparing received measurement data to measurement values which historically indicate the occurrence of an arc event.

In some embodiments of the present principles, the method 300 an arc event is determined to be occurring using a machine learning model that has been trained to recognize when an arc event is occurring from received measurement data.

In some embodiments, in the method 300, an action taken to suppress the arc can include turning off power to an RF generator of the plasma chamber process.

In some embodiments, the method 300 can include, after the action is taken to suppress the arc, taking data measurements to determine if the arc was suppressed. In such embodiments, if data measurements taken after the suppression action reflect data measurements previously taken during a process phase of the plasma chamber process, it can be determined that the arc was suppressed. In such embodiments, if data measurements taken after the suppression action reflect data measurements previously taken during an ignition phase of the plasma chamber process, it can be determined that a plasma of the plasma chamber process was destroyed/killed.

Figure 4:
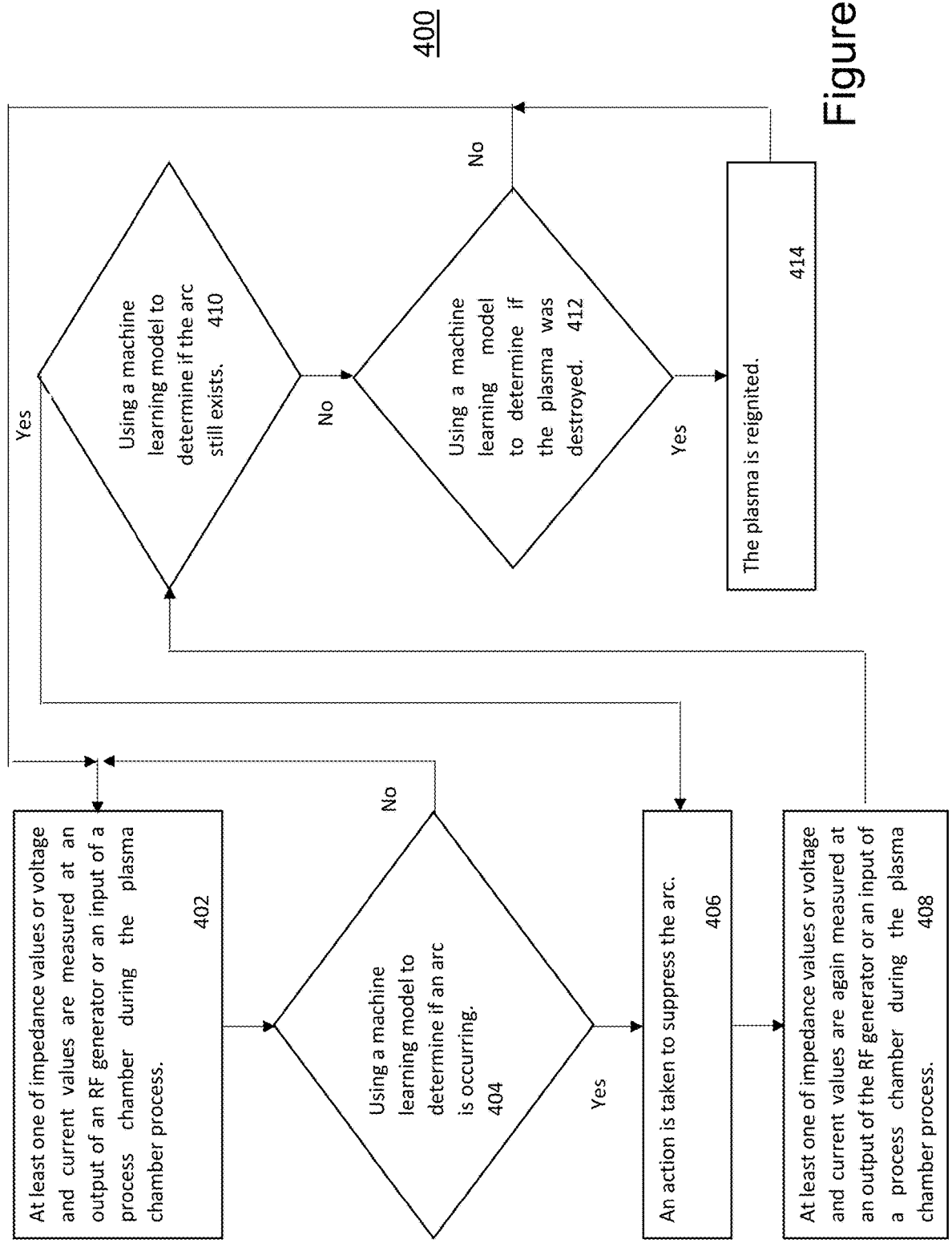
FIG. 4 depicts a flow diagram of a method for detecting and managing arc events in a plasma chamber process in accordance with an alternate embodiment of the present principles.

FIG. 4 depicts a flow diagram 400 of a method for detecting and managing arc events in a plasma chamber process in accordance with an alternate embodiment of the present principles. The method 400 can begin at 402 during which at least one of impedance values or voltage and current values are measured at an output of an RF generator or an input of a process chamber during the plasma chamber process. The method 400 can proceed to 404.

At 404, it is determined, from the measured values, using a machine learning (ML) model, if an arc is occurring during the plasma chamber process. If it is determined that an arc is not occurring, the method 400 can return to 402. If it is determined that an arc is occurring, the method 400 can proceed to 406.

At 406, action is taken to suppress the arc. The method 400 can proceed to 408.

At 408, after the action to suppress the arc is taken, at least one of impedance values or voltage and current values are again measured at an output of the RF generator or an input of a process chamber during the plasma chamber process. The method 400 can then proceed to 410.

At 410, it is determined, from the newly measured values, using the machine learning (ML) model, if the arc still exists (still occurring) during the plasma chamber process. If it is determined that the arc still exists (still occurring), the method 400 can return to 406. If it is determined that the arc does not still exist, the method 400 can proceed to 412.

At 412, it is determined that the arc was suppressed and it is determined, from the newly measured values, using the machine learning (ML) model, if the plasma has been destroyed. If it is determined that the plasma has not been destroyed, the method 400 can return to 402. If it is determined that the plasma has been destroyed, the method proceeds to 414.

At 414, the plasma is reignited. The method 400 can then return to 402 or alternatively be exited.

In some embodiments of the present principles, before at least one of impedance values or voltage and current values are again measured at an output of the RF generator or an input of a process chamber in 408, a capture of the new measurements are delayed to account for a detected arc being a microarc. That is, as described above, a microarc only lasts up to a few hundred milliseconds. Delaying the new measurements after the action taken to suppress the arc by, for example, 500 ms, allows for a microarc to expire before the new measurements.

Figure 5:
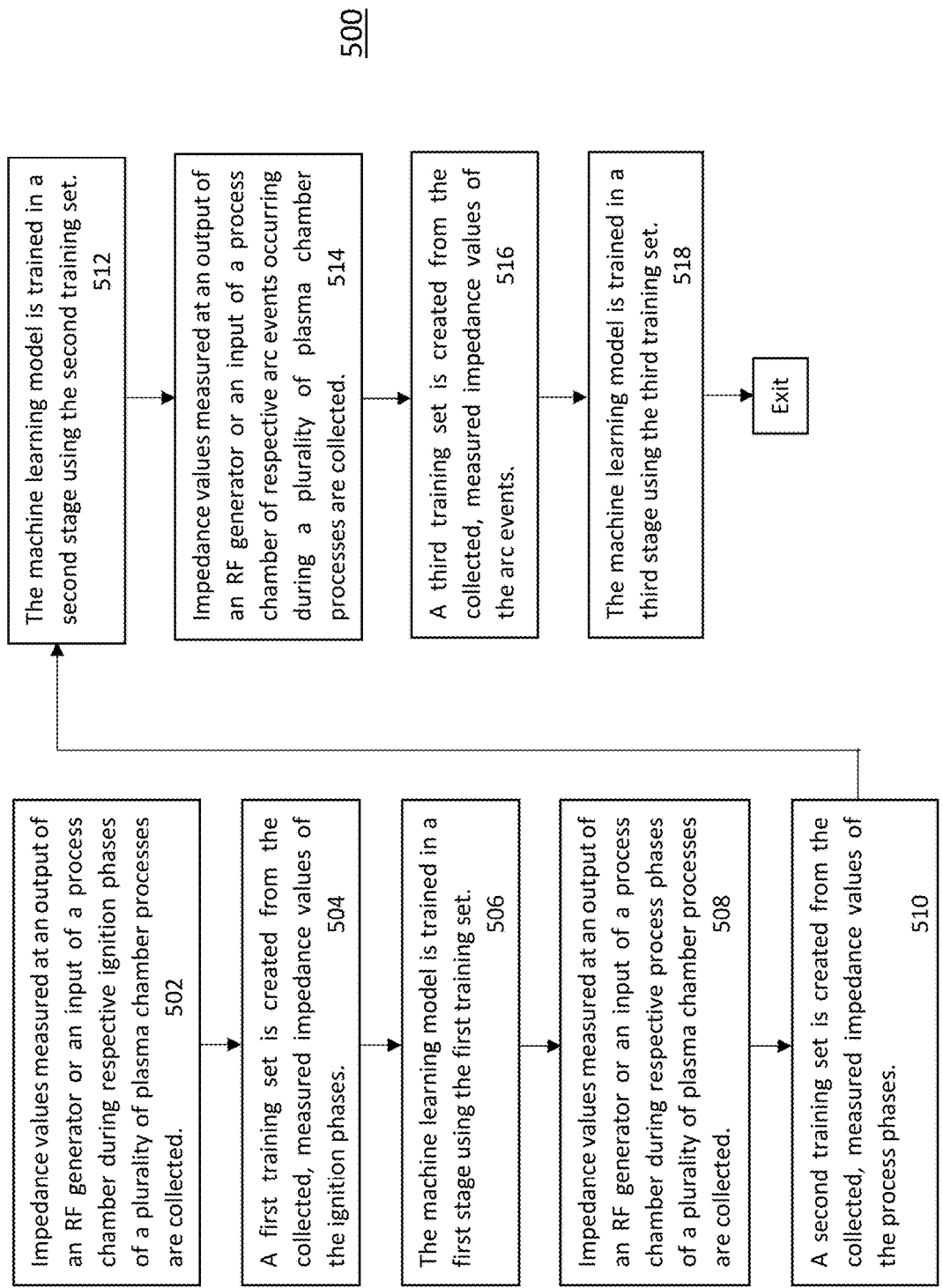
FIG. 5 depicts a flow diagram of a computer-implemented method of training a machine learning model for detecting and managing arc events in a plasma chamber process in accordance with an embodiment of the present principles.

FIG. 5 depicts a flow diagram of a computer-implemented method 500 of training a machine learning model for detecting and managing arc events in a plasma chamber process in accordance with an embodiment of the present principles. The method 500 can begin at 502 during which impedance values measured at an output of an RF generator or an input of a process chamber during respective ignition phases of a plurality of plasma chamber processes are collected. The method 500 can proceed to 504.

At 504, a first training set is created from the collected, measured impedance values of the ignition phases. The method 500 can proceed to 506.

At 506, the machine learning model is trained in a first stage using the first training set. The method 500 can proceed to 508.

At 508, impedance values measured at an output of an RF generator or an input of a process chamber during respective process phases of a plurality of plasma chamber processes are collected. The method 500 can proceed to 510.

At 510, a second training set is created from the collected, measured impedance values of the process phases. The method 500 can proceed to 512.

At 512, the machine learning model is trained in a second stage using the second training set. The method 500 can proceed to 514.

At 514, impedance values measured at an output of an RF generator or an input of a process chamber of respective arc events occurring during a plurality of plasma chamber processes are collected. The method 500 can proceed to 516.

At 516, a third training set is created from the collected, measured impedance values of the arc events. The method 500 can proceed to 518.

At 518, the machine learning model is trained in a third stage using the third training set. The method 500 can then be exited.

Figure 6:
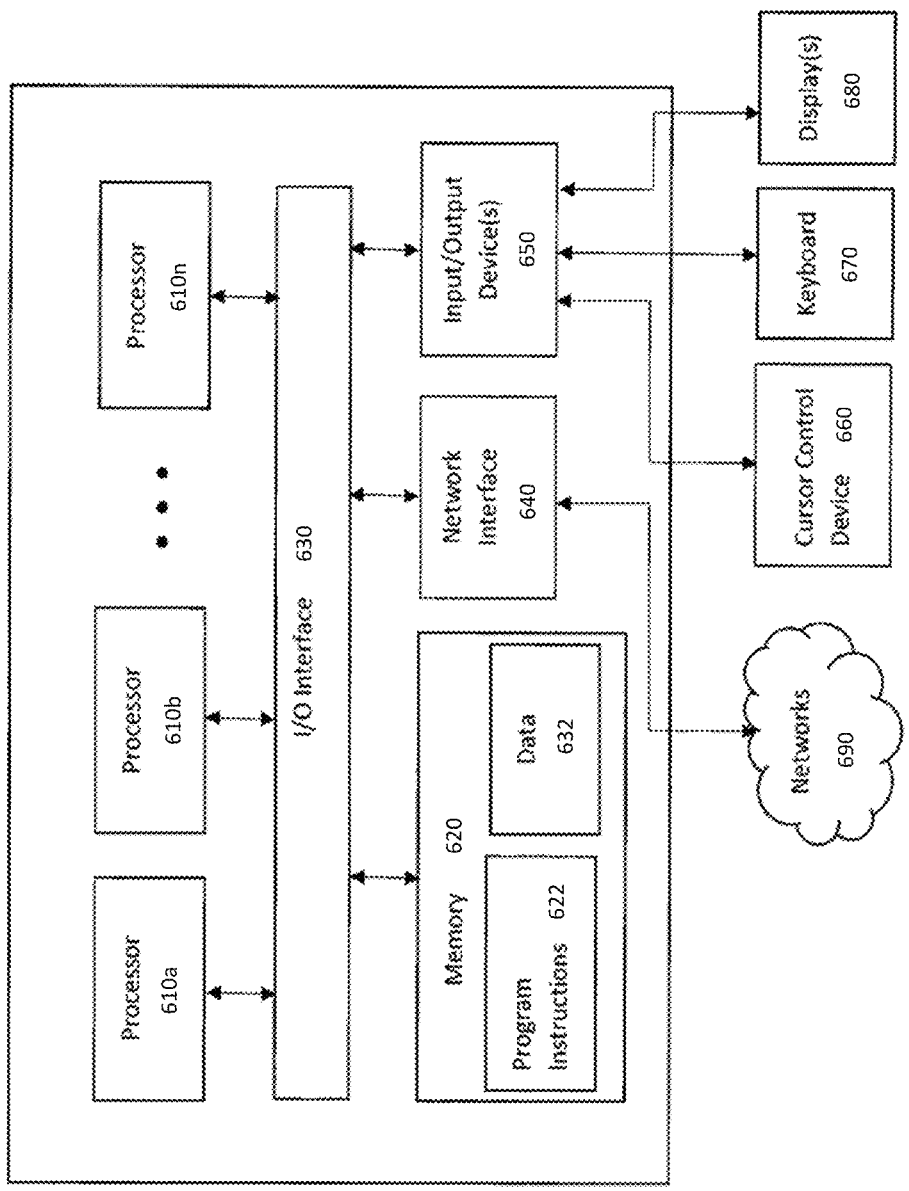
FIG. 6 depicts a high-level block diagram of a computing device suitable for use with embodiments of a plasma chamber process system in accordance with the present principles.

As recited above, in some embodiments, the controller 202 can comprise a computing device 600. FIG. 6 depicts a high-level block diagram of a computing device 600 suitable for use with embodiments of a plasma chamber process system in accordance with the present principles, such as the plasma chamber process system 200 of FIG. 2. In some embodiments, the computing device 600 can be configured to implement methods of the present principles as processor-executable executable program instructions 622 (e.g., program instructions executable by processor(s) 610) in various embodiments.

In the embodiment of FIG. 6, the computing device 600 includes one or more processors 610a-610n coupled to a system memory 620 via an input/output (I/O) interface 630. The computing device 600 further includes a network interface 640 coupled to I/O interface 630, and one or more input/output devices 650, such as cursor control device 660, keyboard 660, and display(s) 680. In various embodiments, a user interface can be generated and displayed on display 680. In some cases, it is contemplated that embodiments can be implemented using a single instance of computing device 600, while in other embodiments multiple such systems, or multiple nodes making up the computing device 600, can be configured to host different portions or instances of various embodiments. For example, in one embodiment some elements can be implemented via one or more nodes of the computing device 600 that are distinct from those nodes implementing other elements. In another example, multiple nodes may implement the computing device 600 in a distributed manner.

In different embodiments, the computing device 600 can be any of various types of devices, including, but not limited to, a personal computer system, desktop computer, laptop, notebook, tablet or netbook computer, mainframe computer system, handheld computer, workstation, network computer, a camera, a set top box, a mobile device, a consumer device, video game console, handheld video game device, application server, storage device, a peripheral device such as a switch, modem, router, or in general any type of computing or electronic device.

In various embodiments, the computing device 600 can be a uniprocessor system including one processor 610, or a multiprocessor system including several processors 610 (e.g., two, four, eight, or another suitable number). Processors 610 can be any suitable processor capable of executing instructions. For example, in various embodiments processors 610 may be general-purpose or embedded processors implementing any of a variety of instruction set architectures (ISAs). In multiprocessor systems, each of processors 610 may commonly, but not necessarily, implement the same ISA.

System memory 620 can be configured to store program instructions 622 and/or data 632 accessible by processor 610. In various embodiments, system memory 620 can be implemented using any suitable memory technology, such as static random-access memory (SRAM), synchronous dynamic RAM (SDRAM), nonvolatile/Flash-type memory, or any other type of memory. In the illustrated embodiment, program instructions and data implementing any of the elements of the embodiments described above can be stored within system memory 620. In other embodiments, program instructions and/or data can be received, sent or stored upon different types of computer-accessible media or on similar media separate from system memory 620 or computing device 600.

In one embodiment, I/O interface 630 can be configured to coordinate I/O traffic between processor 610, system memory 620, and any peripheral devices in the device, including network interface 640 or other peripheral interfaces, such as input/output devices 650. In some embodiments, I/O interface 630 can perform any necessary protocol, timing or other data transformations to convert data signals from one component (e.g., system memory 620) into a format suitable for use by another component (e.g., processor 610). In some embodiments, I/O interface 630 can include support for devices attached through various types of peripheral buses, such as a variant of the Peripheral Component Interconnect (PCI) bus standard or the Universal Serial Bus (USB) standard, for example. In some embodiments, the function of I/O interface 630 can be split into two or more separate components, such as a north bridge and a south bridge, for example. Also, in some embodiments some or all of the functionality of I/O interface 630, such as an interface to system memory 620, can be incorporated directly into processor 610.

Network interface 640 can be configured to allow data to be exchanged between the computing device 600 and other devices attached to a network (e.g., network 690), such as one or more external systems or between nodes of the computing device 600. In various embodiments, network 690 can include one or more networks including but not limited to Local Area Networks (LANs) (e.g., an Ethernet or corporate network), Wide Area Networks (WANs) (e.g., the Internet), wireless data networks, some other electronic data network, or some combination thereof. In various embodiments, network interface 640 can support communication via wired or wireless general data networks, such as any suitable type of Ethernet network, for example; via digital fiber communications networks; via storage area networks such as Fiber Channel SANs, or via any other suitable type of network and/or protocol.

Input/output devices 650 can, in some embodiments, include one or more display terminals, keyboards, keypads, touchpads, scanning devices, voice or optical recognition devices, or any other devices suitable for entering or accessing data by one or more computer systems. Multiple input/output devices 650 can be present in computer system or can be distributed on various nodes of the computing device 600. In some embodiments, similar input/output devices can be separate from the computing device 600 and can interact with one or more nodes of the computing device 600 through a wired or wireless connection, such as over network interface 640.

Those skilled in the art will appreciate that the computing device 600 is merely illustrative and is not intended to limit the scope of embodiments. In particular, the computer system and devices can include any combination of hardware or software that can perform the indicated functions of various embodiments, including computers, network devices, Internet appliances, PDAs, wireless phones, pagers, and the like. The computing device 600 can also be connected to other devices that are not illustrated, or instead can operate as a stand-alone system. In addition, the functionality provided by the illustrated components can in some embodiments be combined in fewer components or distributed in additional components. Similarly, in some embodiments, the functionality of some of the illustrated components may not be provided and/or other additional functionality can be available.

The computing device 600 can communicate with other computing devices based on various computer communication protocols such a Wi-Fi, Bluetooth® (and/or other standards for exchanging data over short distances includes protocols using short-wavelength radio transmissions), USB, Ethernet, cellular, an ultrasonic local area communication protocol, etc. The computing device 600 can further include a web browser.

Although the computing device 600 is depicted as a general-purpose computer, the computing device 600 is programmed to perform various specialized control functions and is configured to act as a specialized, specific computer in accordance with the present principles, and embodiments can be implemented in hardware, for example, as an application specified integrated circuit (ASIC). As such, the process steps described herein are intended to be broadly interpreted as being equivalently performed by software, hardware, or a combination thereof.

Those skilled in the art will appreciate that, while various items are illustrated as being stored in memory or on storage while being used, these items or portions of them can be transferred between memory and other storage devices for purposes of memory management and data integrity. Alternatively, in other embodiments some or all of the software components can execute in memory on another device and communicate with the illustrated computer system via inter-computer communication. Some or all of the system components or data structures can also be stored (e.g., as instructions or structured data) on a computer-accessible medium or a portable article to be read by an appropriate drive, various examples of which are described above. In some embodiments, instructions stored on a computer-accessible medium separate from a computing device of the present principles, such as the computing device 600 can be transmitted to the computing device 600 via transmission media or signals such as electrical, electromagnetic, or digital signals, conveyed via a communication medium such as a network and/or a wireless link. Various embodiments can further include receiving, sending or storing instructions and/or data implemented in accordance with the foregoing description upon a computer-accessible medium or via a communication medium. In general, a computer-accessible medium can include a storage medium or memory medium such as magnetic or optical media, e.g., disk or DVD/CD-ROM, volatile or non-volatile media such as RAM (e.g., SDRAM, DDR, RDRAM, SRAM, and the like), ROM, and the like.

The methods and processes described herein may be implemented in software, hardware, or a combination thereof, in different embodiments. In addition, the order of methods can be changed, and various elements can be added, reordered, combined, omitted or otherwise modified. All examples described herein are presented in a non-limiting manner. Various modifications and changes can be made as would be obvious to a person skilled in the art having benefit of this disclosure. Realizations in accordance with embodiments have been described in the context of particular embodiments. These embodiments are meant to be illustrative and not limiting. Many variations, modifications, additions, and improvements are possible. Accordingly, plural instances can be provided for components described herein as a single instance. Boundaries between various components, operations and data stores are somewhat arbitrary, and particular operations are illustrated in the context of specific illustrative configurations. Other allocations of functionality are envisioned and can fall within the scope of claims that follow. Structures and functionality presented as discrete components in the example configurations can be implemented as a combined structure or component. These and other variations, modifications, additions, and improvements can fall within the scope of embodiments as defined in the claims that follow.

In the foregoing description, numerous specific details, examples, and scenarios are set forth in order to provide a more thorough understanding of the present disclosure. It will be appreciated, however, that embodiments of the disclosure can be practiced without such specific details. Further, such examples and scenarios are provided for illustration, and are not intended to limit the disclosure in any way. Those of ordinary skill in the art, with the included descriptions, should be able to implement appropriate functionality without undue experimentation.

References in the specification to "an embodiment," etc., indicate that the embodiment described can include a particular feature, structure, or characteristic, but every embodiment may not necessarily include the particular feature, structure, or characteristic. Such phrases are not necessarily referring to the same embodiment. Further, when a particular feature, structure, or characteristic is described in connection with an embodiment, it is believed to be within the knowledge of one skilled in the art to affect such feature, structure, or characteristic in connection with other embodiments whether or not explicitly indicated.

Embodiments in accordance with the disclosure can be implemented in hardware, firmware, software, or any combination thereof. Embodiments can also be implemented as instructions stored using one or more machine-readable media, which may be read and executed by one or more processors. A machine-readable medium can include any mechanism for storing or transmitting information in a form readable by a machine (e.g., a computing device or a "virtual machine" running on one or more computing devices). For example, a machine-readable medium can include any suitable form of volatile or non-volatile memory.

Modules, data structures, and the like defined herein are defined as such for ease of discussion and are not intended to imply that any specific implementation details are required. For example, any of the described modules and/or data structures can be combined or divided into sub-modules, sub-processes or other units of computer code or data as can be required by a particular design or implementation.

In the drawings, specific arrangements or orderings of schematic elements can be shown for ease of description. However, the specific ordering or arrangement of such elements is not meant to imply that a particular order or sequence of processing, or separation of processes, is required in all embodiments. In general, schematic elements used to represent instruction blocks or modules can be implemented using any suitable form of machine-readable instruction, and each such instruction can be implemented using any suitable programming language, library, application-programming interface (API), and/or other software development tools or frameworks. Similarly, schematic elements used to represent data or information can be implemented using any suitable electronic arrangement or data structure. Further, some connections, relationships or associations between elements can be simplified or not shown in the drawings so as not to obscure the disclosure.

While the foregoing is directed to embodiments of the present disclosure, other and further embodiments of the disclosure may be devised without departing from the basic scope thereof.

The invention claimed is:

1. A method for detecting and managing arc events during a plasma chamber process, comprising:
   receiving impedance measurement data captured during at least one of an ignition phase, a normal operating process phase or an arc event of the plasma chamber process;
   analyzing the impedance measurement data, using a machine learning process, to determine a status of the plasma chamber process, including at least one of the occurrence of an ignition process, a normal operation, or the arc event during the plasma chamber process;
   if it is determined that an arc event is occurring, taking an action to suppress an arc of the arc event;
   after taking the action to suppress the arc, receiving additional impedance measurement data;
   analyzing the additional impedance measurement data to determine if the additional impedance measurement data includes impedance measurement data that is equal to or within a tolerance of impedance measurement data captured during the normal operating process phase of the plasma chamber process; and
   if the additional impedance measurement data includes impedance measurement data that is equal to or within a tolerance of impedance measurement data captured during the normal operating process phase of the plasma chamber process, determining that the arc was suppressed.

2. The method of claim 1, further comprising:
   receiving at least one of inductance, capacitance, voltage or current measurement data; and
   further analyzing the received at least one of the inductance, capacitance, voltage or current measurement data to determine the status of the plasma chamber process.

3. The method of claim 1, wherein the received measurement data originates from at least one of measurements taken at an output of an RF generator or an input of a process chamber.

4. The method of claim 1, further comprising:
   determining the status of the plasma chamber process by comparing received impedance measurement data to impedance measurement values which historically indicates at least one of the occurrence of an arc event, the occurrence of an ignition process, or a normal operation of the plasma chamber process.

5. The method of claim 1, wherein the machine learning process includes a machine learning model that has been trained to recognize the status of the plasma chamber process using historical impedance data.

6. The method of claim 1, wherein the action taken to suppress the arc includes turning off power to an RF generator of the plasma chamber process.

7. The method of claim 1, further comprising;
   analyzing the additional impedance data measurements to determine if the additional impedance data measurements include impedance data measurements that are equal to or within a tolerance of impedance data measurements captured during the ignition phase of the plasma chamber process;
   if the additional impedance data measurements include impedance data measurements that are equal to or within a tolerance of impedance data measurements captured during the ignition phase of the plasma chamber process, determining that a plasma of the plasma chamber process was destroyed; and
   if the plasma was destroyed, reigniting the plasma.

8. The method of claim 1, further comprising:
   analyzing received reflected voltage and current measurements of the plasma chamber process to determine if a microarc arc event is occurring during the plasma chamber process.

9. A method for detecting and managing arc events during a plasma chamber process, comprising:
   measuring at least one of impedance values or voltage and current values at an output of an RF generator or an input of a process chamber during the plasma chamber process;
   determining from the measured impedance values, using a machine learning (ML) model, a status of the plasma chamber process, including at least one of the occurrence of an arc event, the occurrence of an ignition process, or a normal operation of the plasma chamber process;
   determining from the measured voltage and current values if a microarc is occurring during the plasma chamber process; and
   if at least one of an arc or microarc is occurring during the plasma chamber process, taking action to suppress the at least one arc or microarc;
   after taking the action to suppress the arc, remeasuring at least one of the impedance values or the voltage and current values at the output of the RF generator or the input of a process chamber during the plasma chamber process;
   determining from the remeasured impedance values, using the machine learning (ML) model, if the arc still exists in the plasma chamber process;
   determining from the remeasured voltage and current values, if the microarc still exists;
   if the arc does not still exist, determining from the remeasured at least one of impedance values or voltage and current values, using the machine learning (ML) model, if the plasma has been destroyed; and
   if the plasma has been destroyed, reigniting the plasma.

10. The method of claim 9, wherein determining if the plasma has been destroyed comprises determining if the remeasured at least one of impedance values or voltage and current values include impedance data measurements that are equal to or within a tolerance of impedance data measurements captured during the ignition phase of the plasma chamber process.

11. The method of claim 9, wherein the action taken to suppress the arc includes turning off power to an RF generator of the plasma chamber process.

12. An apparatus for detecting and managing arc events during a plasma chamber process, comprising:
   a processor; and a memory coupled to the processor, the memory having stored therein at least one of programs or instructions executable by the processor to configure the apparatus to:
receive impedance measurement data captured during at least one of an ignition phase, a normal operating process phase or an arc event of the plasma chamber process;
analyze the impedance measurement data to determine a status of the plasma chamber process, including at least one of the occurrence of an ignition process, a normal operation, or the arc event during of the plasma chamber process;
if it is determined that an arc event is occurring, take an action to suppress an arc of the arc event;
after taking the action to suppress the arc, take additional impedance data measurements;
analyze the additional impedance data measurements to determine if the additional impedance data measurements include impedance data measurements that are equal to or within a tolerance of impedance data measurements captured during the process phase of the plasma chamber process; and
if the additional impedance data measurements include impedance data measurements that are equal to or within a tolerance of impedance data measurements captured during the process phase of the plasma chamber process, determine that the arc was suppressed.

13. The apparatus of claim 12, wherein the apparatus is further configured to:
receive at least one of inductance, capacitance, voltage or current measurement data; and
further analyze the received at least one of the inductance, capacitance, voltage or current measurement data to determine the status of the plasma chamber process.

14. The apparatus of claim 12, wherein the apparatus is further configured to:
analyze the additional impedance data measurements to determine if the additional impedance data measurements include impedance data measurements that are equal to or within a tolerance of impedance data measurements captured during the ignition phase of the plasma chamber process;
if the additional impedance data measurements include impedance data measurements that are equal to or within a tolerance of impedance data measurements captured during the ignition phase of the plasma chamber process, determine that a plasma of the plasma chamber process was destroyed; and
if the plasma was destroyed, reignite the plasma.

* * * * *